(12) United States Patent
Yang et al.

(10) Patent No.: US 9,984,769 B2
(45) Date of Patent: May 29, 2018

(54) 3D MEMORY WITH ERROR CHECKING AND CORRECTION FUNCTION

(71) Applicant: RESEARCH & BUSINESS FOUNDATION SUNGKYUNKWAN UNIVERSITY, Suwon-si (KR)

(72) Inventors: Joon-sung Yang, Seongnam-si (KR); Hyunseung Han, Seoul (KR)

(73) Assignee: Research & Business Foundation Sungkyunkwan University, Suwon-si (KR)

( * ) Notice: Subject to any disclaimer, the term of this patent is extended or adjusted under 35 U.S.C. 154(b) by 5 days.

(21) Appl. No.: 14/928,317

(22) Filed: Oct. 30, 2015

(65) Prior Publication Data

US 2016/0124810 A1     May 5, 2016

(30) Foreign Application Priority Data

Oct. 30, 2014   (KR) .................. 10-2014-0149359
Sep. 4, 2015    (KR) .................. 10-2015-0125383

(51) Int. Cl.
  *G11C 29/52*    (2006.01)
  *G11C 29/42*    (2006.01)
  (Continued)

(52) U.S. Cl.
  CPC .......... *G11C 29/52* (2013.01); *G06F 11/1048* (2013.01); *G11C 29/42* (2013.01);
  (Continued)

(58) Field of Classification Search
  CPC ..... H01L 25/0657; G11C 5/02; G11C 29/808; G11C 2213/71; G11C 29/52
  See application file for complete search history.

(56) References Cited

U.S. PATENT DOCUMENTS 5,432,729 A  *  7/1995  Carson ................ H01L 25/0657
                                                  257/673
5,828,599 A  * 10/1998  Herdt ................. G11C 16/0466
                                                  365/185.08
(Continued)

FOREIGN PATENT DOCUMENTS

KR   10-2010-0011613 A   2/2010

OTHER PUBLICATIONS

Y. F. Chou, D. M. Kwai, M. D. Shieh and C. W. Wu, "Reactivation of Spares for Off-Chip Memory Repair After Die Stacking in a 3-D IC With TSVs," in IEEE Transactions on Circuits and Systems I: Regular Papers, vol. 60, No. 9, pp. 2343-2351, Sep. 2013.*

(Continued)

*Primary Examiner* — Steve Nguyen
(74) *Attorney, Agent, or Firm* — NSIP Law

(57) ABSTRACT

An error check and correction method of a 3D memory include a) storing check bits, which is used for error check and correction of an upper memory among the plurality of the memory layers, in one or more of spare cell arrays of a lower memory layer stacked below the upper memory layer and the upper memory layer; and b) performing error check and correction of the upper memory layer by using the stored check bits, wherein in the 3D memory, there are stacked a plurality of memory layers comprising a memory cell array with a matrix structure consisting of memory cells and a spare cell array with a matrix structure consisting of spare memory cells for replacing a fault memory cell, in which a fault occurs, and the 3D memory comprises a master layer for controlling the plurality of the memory layers.

10 Claims, 6 Drawing Sheets

(51) Int. Cl.
*G11C 29/44* (2006.01)
*G11C 29/00* (2006.01)
*G06F 11/10* (2006.01)
*G11C 29/04* (2006.01)

(52) U.S. Cl.
CPC .......... *G11C 29/4401* (2013.01); *G11C 29/76* (2013.01); *G11C 2029/0411* (2013.01)

(56) References Cited

U.S. PATENT DOCUMENTS

| | | | | |
|---|---|---|---|---|
| 6,373,758 | B1* | 4/2002 | Hughes | G11C 29/44 365/200 |
| 7,936,622 | B2* | 5/2011 | Li | G11C 5/02 365/130 |
| 9,318,164 | B2* | 4/2016 | Lee | G11C 5/148 |
| 9,318,224 | B2* | 4/2016 | Kwak | G11C 29/82 |
| 9,389,972 | B2* | 7/2016 | Chadha | G06F 11/2094 |
| 9,432,298 | B1* | 8/2016 | Smith | H04L 49/9057 |
| 2006/0028864 | A1* | 2/2006 | Rinerson | G11C 11/16 365/158 |
| 2009/0180339 | A1* | 7/2009 | Kim | G11C 29/808 365/200 |
| 2011/0007588 | A1* | 1/2011 | Li | G11C 5/02 365/200 |
| 2011/0075478 | A1* | 3/2011 | Yoon | G06F 11/1072 365/185.03 |
| 2012/0185753 | A1* | 7/2012 | Chen | G06F 11/1048 714/773 |
| 2013/0028027 | A1* | 1/2013 | Kim | G11C 16/0483 365/185.22 |
| 2013/0279280 | A1* | 10/2013 | Franzon | G11C 29/04 365/200 |
| 2013/0294140 | A1* | 11/2013 | Oh | G11C 17/16 365/96 |
| 2013/0294184 | A1* | 11/2013 | Yang | H01L 25/0657 365/200 |
| 2013/0339821 | A1* | 12/2013 | Cordero | G06F 11/1666 714/773 |
| 2014/0040698 | A1* | 2/2014 | Loh | G06F 13/1668 714/758 |

OTHER PUBLICATIONS

M. T. Rab, A. A. Bawa and N. A. Touba, "Using asymmetric layer repair capability to reduce the cost of yield enhancement in 3D stacked memories," 2012 IEEE/IFIP 20th International Conference on VLSI and System-on-Chip (VLSI-SoC), Santa Cruz, CA, USA, 2012, pp. 195-200.*

B. Y. Lin et al., "Redundancy architectures for channel-based 3D DRAM yield improvement," 2014 International Test Conference, Seattle, WA, 2014, pp. 1-7.*

Chun-Chuan Chi et al., "3D-IC BISR for stacked memories using cross-die spares," Proceedings of Technical Program of 2012 VLSI Design, Automation and Test, Hsinchu, 2012, pp. 1-4.*

C. Lee, W. Kang, D. Cho and S. Kang, "A New Fuse Architecture and a New Post-Share Redundancy Scheme for Yield Enhancement in 3-D-Stacked Memories," in IEEE Transactions on Computer-Aided Design of Integrated Circuits and Systems, vol. 33, No. 5, pp. 786-797, May 2014.*

* cited by examiner

3D MEMORY WITH ERROR CHECKING AND CORRECTION FUNCTION

CROSS-REFERENCE TO RELATED APPLICATION

This application claims the benefit of Korean Patent Application No. 10-2014-0149359 filed on Oct. 30, 2014 and No. 10-2015-0125383 filed on Sep. 4, 2015, the disclosures of which are incorporated herein by reference.

TECHNICAL FIELD

The embodiments described herein pertain generally to a 3D memory, more particular, a 3D memory and a method for improving error check and correction (ECC) performance of the 3D memory.

BACKGROUND

Recently, as integration density of a memory improves, occurrence possibility of a soft error in a memory increases. Thus, in order to solve this problem, importance of an error check and correction memory has increased. A soft error may occur due to electromagnetic interference, static electricity, a cosmic ray and others. For example, a soft error may occur due to a charge generated by ionization radiation.

For example, where α (alpha) particles penetrate a 3D memory having high memory integration density, the α particle generates an electron-hole pair near a memory cell. Then, if an amount of a charge of the generated electron-hole pair exceeds a certain threshold value, the a particles may become a cause for a bit error. Further, as integration density of a memory increases, occurrence possibility of a fault of a memory cell in a 3D memory may also increase.

Error check and correction within a memory for checking and correcting an error occurring within a memory are carried out through an error correction code. In order to overcome an error occurring in a memory, the error check and correction are necessary. Thus, error correction codes of a memory such as a SEC-DED code and a SEC-DED-DAEC code have been essential for design of a memory.

In order to overcome limit of storage capacity of a memory, research on a 3D memory has been actively conducted for recent years. A 3D memory, in which a multiple number of memory layers are stacked, has had a problem since a soft error will be highly likely to occur in an upper memory layer among the multiple memory layers. This is because most α particles crash onto the upper memory layer first among the multiple stacked memory layers, and the upper memory layer protects lower memory layers from the α particles.

Further, reliability of the 3D memory, which has recently attracted interests, is determined mainly by reliability of an upper slice, and a method for improving error check and correction performance of the upper memory layer of the 3D memory is necessary.

SUMMARY

In view of the foregoing, example embodiments provide a method for improving error check and correction performance of a 3D memory, which is capable of improving error check and correction performance of a 3D memory by storing check bits used for error check and correction of an upper memory layer of a 3D memory in spare cell arrays of lower memory layers.

As a technical means for solving the above-described problem, in accordance with a first exemplary embodiment, there is provided an error check and correction method of a 3D memory, in which a plurality of memory layers are stacked. The method may include a) storing check bits, which is used for error check and correction of an upper memory among the plurality of the memory layers, in one or more of spare cell arrays of a lower memory layer stacked below the upper memory layer and the upper memory layer; and b) performing error check and correction of the upper memory layer by using the stored check bits, wherein in the 3D memory, there are stacked a plurality of memory layers comprising a memory cell array with a matrix structure consisting of memory cells and a spare cell array with a matrix structure consisting of spare memory cells for replacing a fault memory cell, in which a fault occurs, and the 3D memory comprises a master layer for controlling the plurality of the memory layers.

Further, in accordance with a second exemplary embodiment, there is provided a 3D memory having an error check and correction function. The 3D memory may include a plurality of memory layers each having a memory cell array and a spare cell array, and being stacked on one another in a vertical direction; and a master layer for controlling the plurality of the memory layers, wherein the master layer stores a check bit, which is used for error check and correction of an upper memory layer among the plurality of the memory layers, in the spare cell array of one or more lower memory layers stacked below the upper memory layer, the error check and correction of the upper memory layer is performed by using the stored check bit, and the spare cell array consists of one or more spare memory cells for replacing a fault memory cell, in which a fault occurs.

In accordance with the example embodiments, there is an effect on improving error check and correction performance of an upper memory layer by storing check bits used for error check and correction of an upper memory layer of a 3D memory in a spare cell array of a lower memory layer.

In case of a 3D memory, error check and correction performance of an upper memory layer affects error check and correction performance of the whole 3D memory. Thus, there is an effect on improving the error check and correction performance of the 3D memory itself by improving error check and correction performance of an upper memory layer.

DETAILED DESCRIPTION

Figure 1:
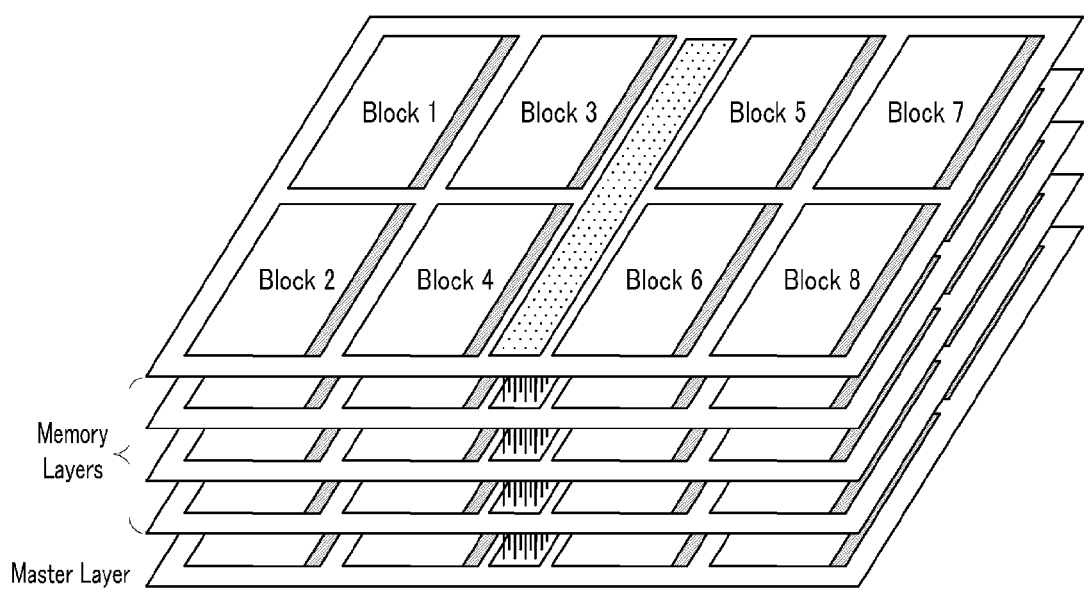
FIG. 1 depicts a structure of a 3D memory having an error check and correction function in accordance with an example embodiment.

Hereinafter, example embodiments will be described in detail with reference to the accompanying drawings so that inventive concept may be readily implemented by those skilled in the art. However, it is to be noted that the present disclosure is not limited to the example embodiments but can be realized in various other ways. In the drawings, certain parts not directly relevant to the description are omitted to enhance the clarity of the drawings, and like reference numerals denote like parts throughout the whole document.

The present disclosure may be subject to various modifications and have various example embodiments. Thus, specific example embodiments are illustrated in the drawings and described in detail herein. However, the present disclosure is not limited to the example embodiments and should be construed as including any modifications, equivalents or substituents, which belong to the technical concept and scope of the present disclosure.

Hereinafter, preferable example embodiments of the present disclosure are described in detail with reference to the accompanying drawings. In the drawings, the same reference numeral refers to the same element.

Figure 2A:
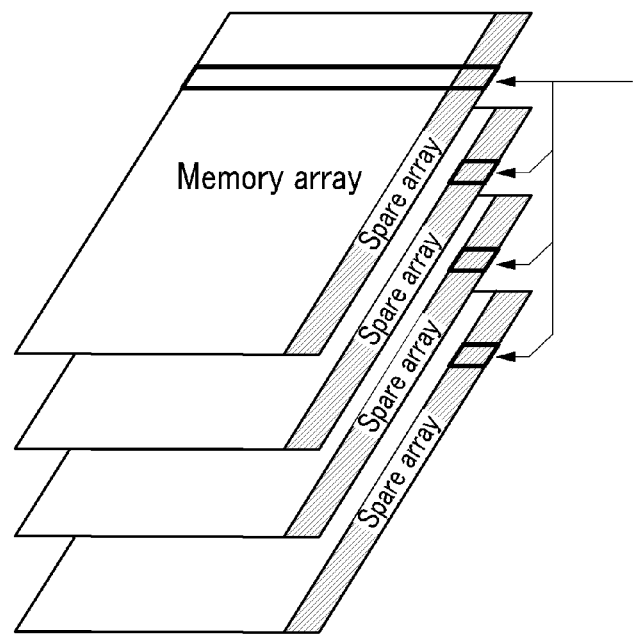
FIG. 2A and FIG. 2B are conceptual diagrams for depicting an error check and correction method of the 3D memory in accordance with an example embodiment.
Figure 2B:
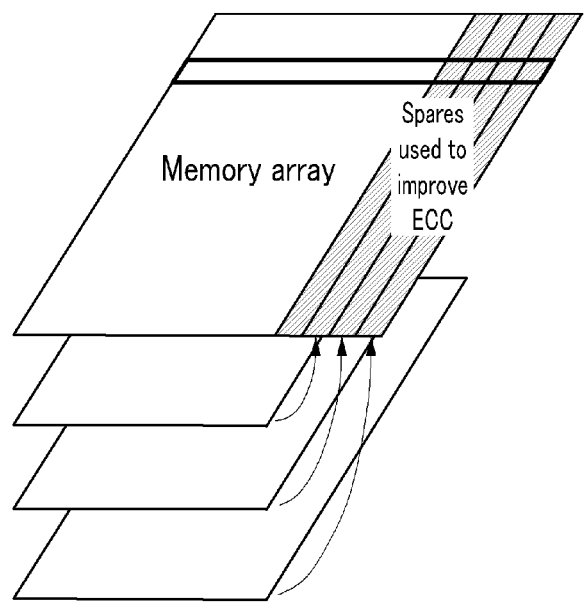

Next, a structure of a 3D memory having an error check and correction function is described referring to FIG. 1, FIG. 2A and FIG. 2B.

FIG. 1 depicts a structure of a 3D memory having an error check and correction function in accordance with an example embodiment.

The 3D memory having the error check and correction function in accordance with an example embodiment includes a multiple number of memory layers and a master layer. In this case, each of the multiple memory layers includes a memory cell array and a spare cell array. Also, the multiple memory layers are stacked on one another in a vertical direction. The master layer controls the multiple memory layers.

Specifically, in the 3D memory having the error check and correction function in accordance with an example embodiment, a multiple number of memory layers, in which a multiple number of memory banks are arranged, are stacked on one another. Referring to FIG. 1, on one memory layer included in the 3D memory, the multiple memory banks (Banks 1 to 8) are arranged while being regularly spaced from one another.

The multiple memory layers may transmit and receive a signal with one another through a through silicon via (TSV) electrode, which is provided in the center of each of the memory layers. The through silicon via electrode may penetrate the multiple memory layers.

Each of the multiple memory layers has a column selection line (CSL). Each of the memory layers may control a signal to be transmitted to and received in one or more of a memory column and a spare column through the column selection line.

Each of the memory banks includes a memory cell array having a matrix structure consisting of memory cells, and a spare cell array to replace a fault memory cell, in which a fault occurs.

As shown in FIG. 1, the 3D memory may have a structure, in which the multiple memory banks are arranged on one memory layer. However, as shown in FIG. 2A and FIG. 2B, the 3D memory may consist of a group of multiple memory layers, each having one memory bank arranged thereon.

FIG. 2A and FIG. 2B are conceptual diagrams for depicting an error check and correction method of the 3D memory in accordance with an example embodiment.

Specifically, as shown in FIG. 2A, each of the multiple memory layers of the 3D memory may include one memory bank. That is, each of the multiple memory layers may include one memory bank including a memory cell array and a spare cell array. The memory cell array may have a matrix structure consisting of memory cells. The spare cell array may have a matrix structure consisting of spare memory cells for replacing a fault memory cell, in which a fault occurs.

For example, the multiple memory layers may have a structure, in which they are stacked on one another in a vertical direction. In order to improve error check and correction performance of an upper memory layer among the multiple memory layers, as illustrated in FIG. 2A, the 3D memory may use the spare cell arrays of the three (3) lower memory layers, which are stacked below the upper memory layer, as a spare cell array of the upper memory layer. Thus, as shown in FIG. 2B, the upper memory layer may perform error check and correction by using the spare cell array included in the upper memory layer and the spare cell arrays of the lower memory layers.

Meanwhile, the master layer may control signal transmission and reception among the multiple memory layers.

In addition, the master layer stores check bits, which is used for the error check and correction of the upper memory layer among the multiple memory layers, in the spare cell array of one or more of the lower memory layers stacked below the upper memory layer. That is, the master layer may store check bits in a spare cell of one or more of the lower memory layers stacked below the upper memory layer and the spare cell array of the upper memory layer. The master layer performs the error check and correction of the upper memory layer by using the stored check bits.

In this case, each of the lower memory layers includes a column selection line. Thus, the upper memory layer and the lower memory layers may use the spare cell arrays of the lower memory layer as the spare cell array of the upper memory layer by electrically connecting the column selection lines of the lower memory layers with the upper memory layer. This process will be described later with reference to FIG. 4.

In order to repair the memory cell array by replacing the fault column of the memory cell array having a fault memory cell with the spare column of the spare cell array, the master layer may determine whether a fault column having a fault memory cell exists in the memory cell array of each of the multiple memory layers. If the fault column exists, the master layer may replace the fault column with the spare column of the spare cell array of the corresponding memory layer having the fault column. For example, the master layer may perform replacement of a fault column and a spare column through on/off of a signal line connecting the fault column and the spare column. In this case, the signal line may be the column signal line.

The master layer may store check bits, which is used for the error check and correction of the upper memory layer, in a spare column that has not been used for the replacement among the multiple memory layers.

In addition, the master layer may perform the electrical connection through the column selection line of the corresponding memory layer, in which a spare column that has not been used for the replacement is arranged. In this case, the column selection line may control the spare column that has not been used for the replacement.

The master layer may electrically connect the spare cell array of the upper memory layer and the spare cell arrays of the lower memory layers through on/off control of the column selection line and the through silicon via electrode. Through the electrical connection, the master layer may enable check bits to be stored in one or more of the lower memory layers.

Next, the error check and correction method of the 3D memory in accordance with an example embodiment is described referring to FIG. 3 to FIG. 6C.

Figure 3:
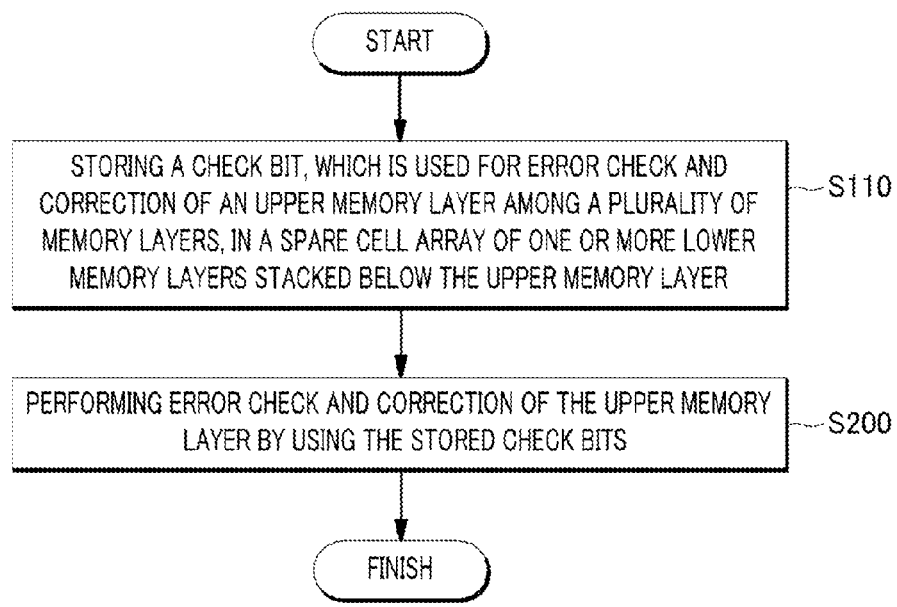
FIG. 3 is a flow chart of the error check and correction method of the 3D memory in accordance with an example embodiment.
Figure 4:
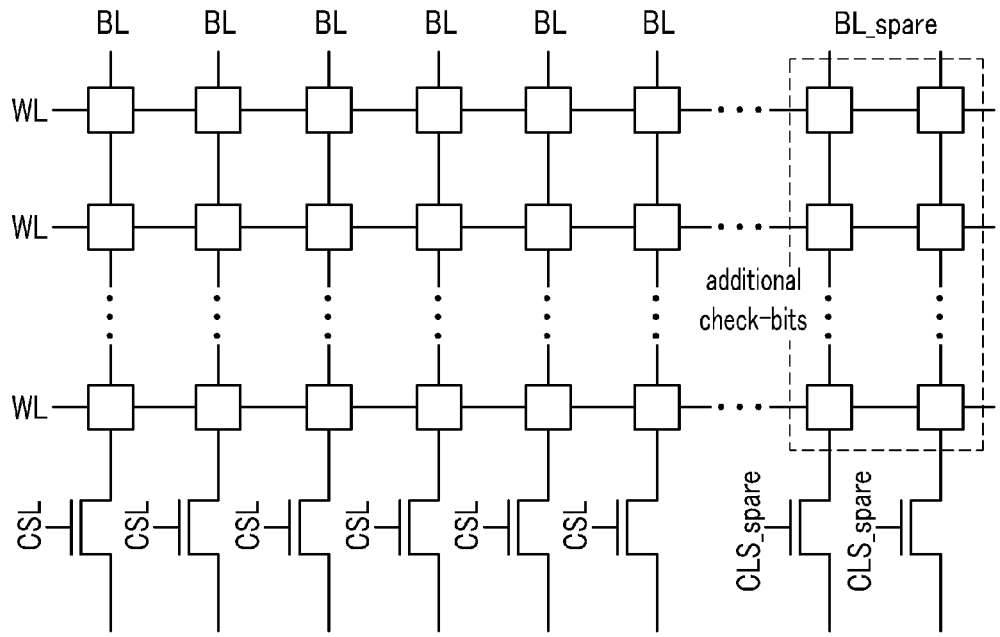
FIG. 4 is a conceptual diagram for depicting a method of storing check bits of an upper memory layer in a spare cell array of a lower memory layer in accordance with an example embodiment.

FIG. 3 is a flow chart of the error check and correction method of the 3D memory in accordance with an example embodiment. FIG. 4 is a conceptual diagram for depicting a method of storing the check bits of the upper memory layer in the spare cell array of the lower memory layer. In FIG. 4, WL means a word line, BL means a bit line, CSL means a column selection line, BL_spare means a bit line of a spare cell array, and CLS_spare means a column selection line, which can select a spare column for transmitting and receiving a signal.

As described above referring to FIG. 1, in the 3D memory in accordance with an example embodiment, there are stacked a multiple number of memory layers, each having a memory cell array with a matrix structure consisting of memory cells and a spare cell array with a matrix structure consisting of spare memory cells for replacing a fault memory cell, in which a fault occurs. In addition, the 3D memory includes a master layer, which controls the multiple memory layers.

In this case, the 3D memory stores check bits, which is used for error check and correction of an upper memory layer among the multiple memory layers, in one or more of the spare cell arrays of a lower memory layer stacked below the upper memory layer and the upper memory layer (S100).

The 3D memory performs error check and correction of the upper memory layer by using the stored check bits (S200).

In order to perform the error check and correction method of the 3D memory, the 3D memory stores check bits, which is used for the error check and correction of the upper memory layer among the multiple memory layers, in one or more of the spare cell arrays of the lower memory layer stacked below the upper memory layer and the upper memory layer (S100).

Referring to FIG. 4, each of the lower memory layers has a column selection line (CSL). Thus, the 3D memory may electrically connect the column selection lines of the lower memory layers with the upper memory layer. That is, the 3D memory may use the spare cell arrays of the lower memory layers as the spare cell array of the upper memory layer.

For example, in the 3D memory, a signal between the upper memory layer and the lower memory layer may be transmitted and received through a through silicon via electrode. The signal between the upper memory layer and the lower memory layer may be transmitted and received in the spare cell array of the lower memory layer through the column selection line of the lower memory layer.

In this case, the transmission and reception of the signal may be performed by controlling on/off of the column selection line of the lower memory line, or by electrically connecting the spare cell array of the lower memory layer with the upper memory layer through the column selection line of the lower memory layer. Thus, the 3D memory may use the spare cell array of the lower memory layer like the spare cell array of the upper memory layer, through the transmission and reception of the signal. Accordingly, the check bits, which is used for the error check and correction of the upper memory layer, may be stored in the spare cell array of the lower memory layer. Since the method of storing the check bits, which is used for the error check and correction of the upper memory layer, in the spare cell array of the upper memory layer is the same as a generally used method of storing check bits, detailed description of the method is omitted herein.

Meanwhile, in order to store the check bits in one or more of the spare cell arrays of the lower memory layers stacked below the upper memory layer and the upper memory layer (S100), the 3D memory may first determine whether a fault column having a fault memory cell exists in the memory cell array of each of the multiple memory layers (S120).

If the fault column exists, the 3D memory may replace the fault column with the spare column of the spare cell array of the corresponding memory layer having the fault column (S140).

In addition, the 3D memory may store check bits, which is used for the error check and correction of the upper memory layer, in a spare column that has not been used for the replacement among the multiple memory layers (S160).

In order to repair the memory cell array by replacing the fault column of the memory cell array having the fault memory cell with the spare column of the spare cell array, the 3D memory determines whether a fault column having a fault memory cell exists in the memory cell array of each of the multiple memory layers (S120).

Depending on the result of the determination of whether the fault column exists, if there is the fault column, the fault column is replaced with the spare column of the spare cell array of the corresponding memory layer having the fault column (S140). For example, the replacement of the fault column with the spare column may be performed through on/off of a signal line connecting the fault column and the spare column to each other. In this case, the signal line may be the column signal line.

Figure 6A:
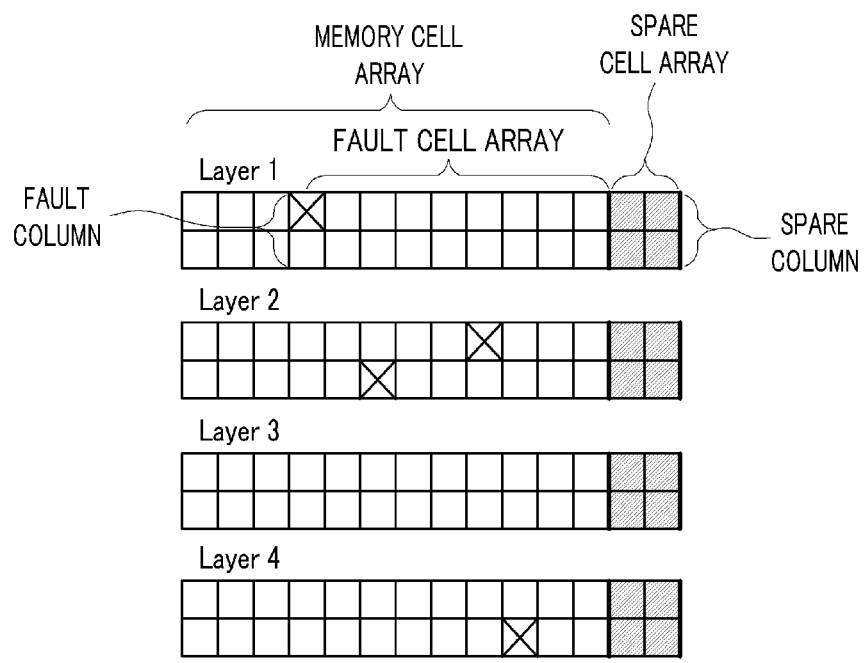
FIG. 6A to FIG. 6C are conceptual diagrams for depicting a method of storing check bits of an upper memory layer in a spare cell array of a lower memory layer in accordance with Example 2.

Referring to FIG. 6A, a memory cell array of an upper memory layer 1 has one fault memory cell. In this case, the fault column of the layer 1, which includes the fault memory cell, may be repaired by the spare column of the spare cell array.

Figure 6B:
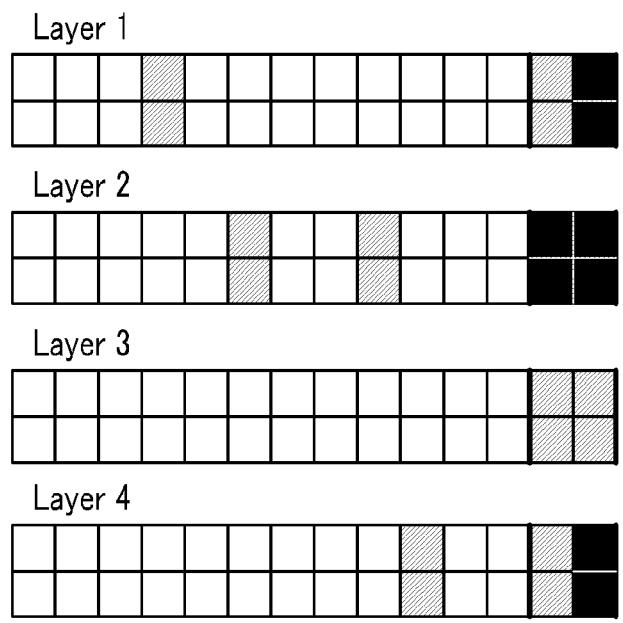

FIG. 6B illustrates the repaired memory layer. In FIG. 6A, the fault column of the layer 1 may be replaced with the spare column of the spare cell array. Thus, as shown in FIG. 6B, the replaced fault column is placed in the spare cell. Through this replacement method, layer 2 (610), layer 3 (620) and layer 4 (630) of the 3D memory may also be repaired.

Once the replacement of the fault column is completed, the 3D memory stores check bits, which is used for the error check and correction of the upper layer, in a spare column that has not be used for the replacement among the multiple memory layers (S160). For example, the 3D memory controls a signal to be transmitted and received through a column signal line controlling a spare column that has not been replaced, and then, store check bits, which is used for the error check and correction of the upper memory layer, in the spare column. That is, the 3D memory may electrically connect a spare column, which has not been used for the replacement, and the upper memory layer through the column signal line (CSL) so as to enable a signal to be transmitted and received there between.

In the 3D memory, the method of storing check bits, which is used for the error check and correction of the upper memory layer, may include Example 1 for the case where the multiple memory layers have no fault memory, and Example 2 for the case where the multiple memory layers have a fault memory.

EXAMPLE 1

Figure 5A:
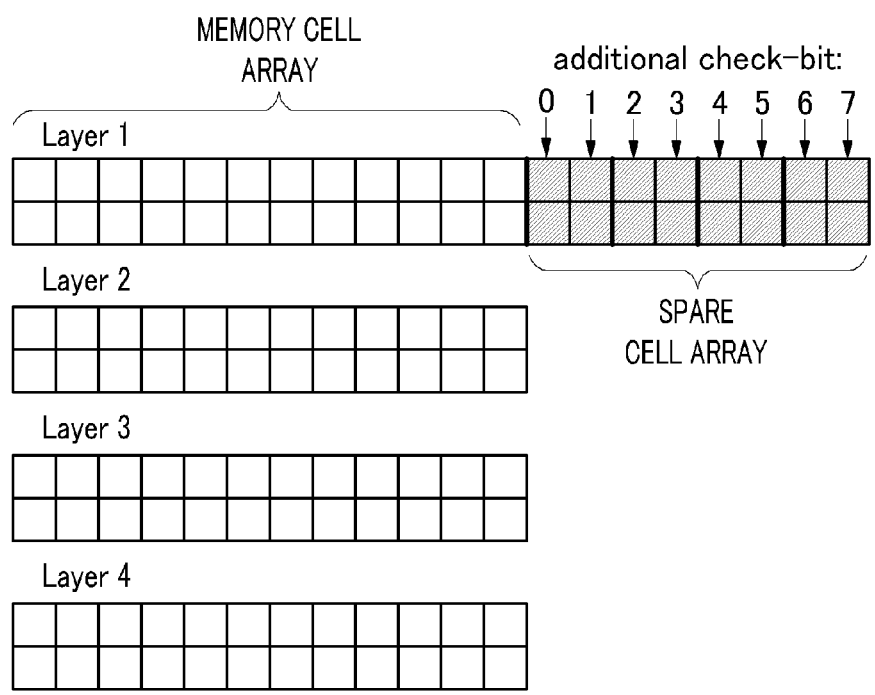
FIG. 5A and FIG. 5B are conceptual diagrams for depicting a method of storing checks bit of an upper memory layer in a spare cell array of a lower memory layer in accordance with Example 1.
Figure 5B:
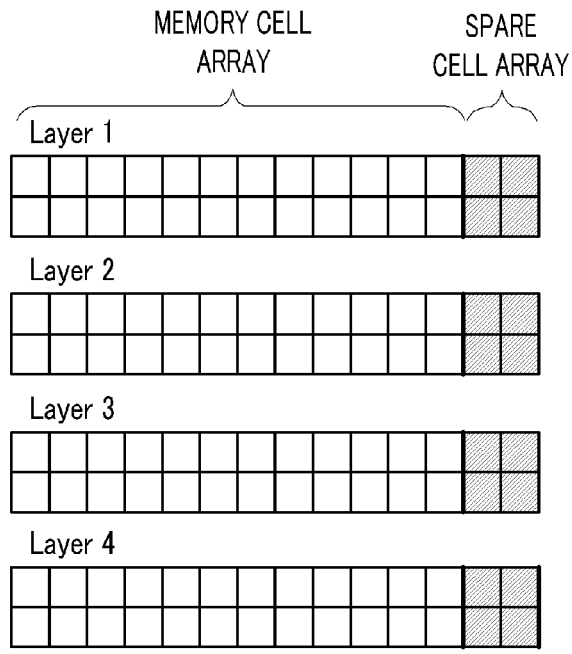

FIG. 5A and FIG. 5B are conceptual diagrams for depicting a method of storing check bits of an upper memory in a spare cell array of a lower memory layer in accordance with Example 1.

Referring to FIG. 5A, each of the multiple memory layers may include a spare cell array of a 2×2 structure. The multiple memory layers have no fault memory cell. Thus, all the spare cell arrays included in the lower memory layers may be used as the spare cell array of the upper memory layer.

Accordingly, the check bits, which is used for the error check and correction of the upper layer 1, may be stored in the spare cell array of the upper memory layer 1 indicated as 0 and 1 in FIG. 5B. In addition, the check bits, which is used for error check and correction of the upper memory layer 1, may be stored in the spare cell array of each of the lower memory layers (layers 2 to 4) indicated as 2 to 7 among the spare cell arrays of the upper memory layer 1.

EXAMPLE 2

Figure 6C:
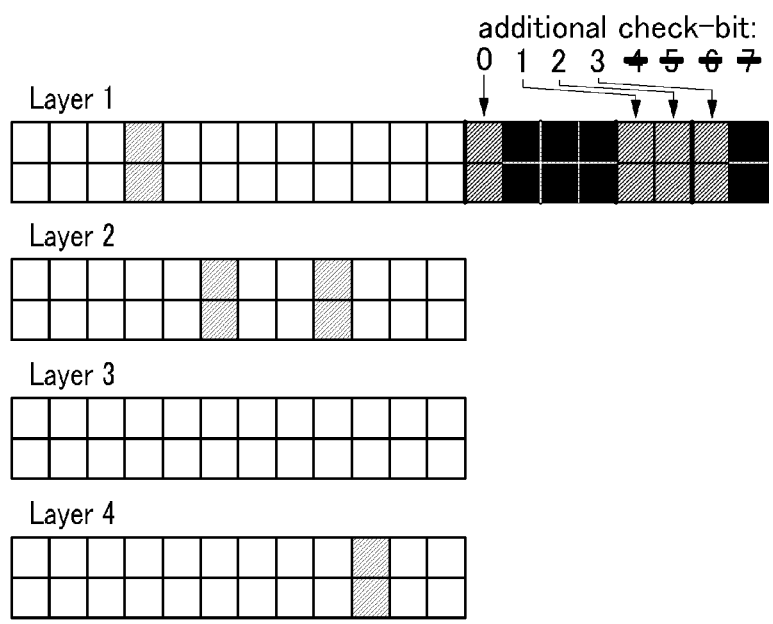

FIG. 6A to FIG. 6C are conceptual diagrams for depicting a method of storing check bits of the upper memory layer in the spare cell array of the lower memory layer in accordance with Example 2.

Referring to FIG. 6A, each of the multiple memory layers 1 to 4 includes a spare cell array having a 2×2 structure. Among the multiple memory layers, the layers 1, 2 and 4 have one or more fault memory cells. Thus, the fault columns of the multiple memory layers having the fault memory cells may be replaced with the spare column included in the corresponding memory layer so as to repair the memory array. Once the replacement of the fault column is completed, the 3D memory may store check bits, which is used for the error check and correction of the upper memory layer 1, in a spare column that has not been used for the replacement among the spare cell arrays of the lower memory layers 2 to 4.

Accordingly, referring to FIG. 6C, the check bits, which is used for the error check and correction of the upper memory layer 1, may be stored in a spare column that has not been replaced with the fault column, among the spare columns included in the upper memory layer 1. That is, the check bits, which is used for the error check and correction of the upper memory layer 1, may be stored in the spare array indicated as 0 in the upper memory layer 1. In addition, the check bits, which is used for the error check and correction of the upper memory layer 1, may be stored in a spare array that has not been used for the replacement of the lower memory layers 2 to 4 indicated as 1 to 3 among the spare cell arrays of the upper memory layer 1 in FIG. 6C.

Next, the 3D memory implements the error check and correction of the upper memory layer by using the stored check bits (S200). In this case, the error check and correction may be performed by a generally used method. For example, the error check and correction may be performed by a SEC-DED Hsiao code method.

In the 3D memory and the error check and correction method of the 3D memory in accordance with the example embodiments, the check bits, which is used for the error check and correction of the upper memory layer, may be stored in the spare cell array of the lower memory layer, and thus, the error check and correction performance of the upper memory layer can be improved. Below are descriptions in this regard referring to Table 1.

[Table 1] provides results for a maximally bearable bit error rate. In Table 1, the conventional ECC is a result obtained from measuring a maximally bearable bit error rate of a 3D memory through a conventional error check and correction method. The ECC in accordance with the example embodiments is a result obtained from measuring a maximally bearable bit error rate of a 3D memory by applying the error check and correction method of the 3D memory in accordance with the example embodiments.

For the measurement of the maximally bearable bit error rate through the conventional error check and correction method and the error check and correction method of the 3D memory in accordance with the example embodiments, 32-bit and 64-bit words were used, and a 1 GB memory (256 MBx4, 128 MBX8, 64 MBX16), in which 4, 8 and 16 layers were stacked, were used. For the error check and correction method, the SEC-DED Hsiao code method was used. In nLmS (n=4, 8, 16, and m=1, 2, 3, 4) of Table 1, nL refers to the number of memory layers stacked, and mS refers to the number of spare columns, in which the check bits used for the error check and correction of the upper memory layer are stored.

TABLE 1

|      | Conventional ECC | | ECC in accordance with the Example Embodiments | | Increase Rate (Times) | |
|------|---------|---------|---------|---------|------------|------------|
|      | 32-bit  | 64-bit  | 32-bit  | 64-bit  | 32-bit     | 64-bit     |
| 4L1S | 2.65E−6 | 1.83E−6 | 5.21E−6 | 3.60E−6 | about 1.97 | about 1.97 |
| 4L2S | 3.34E−6 | 2.30E−6 | 1.11E−5 | 7.60E−6 | about 3.32 | about 3.30 |
| 4L3S | 4.21E−6 | 2.90E−6 | 1.46E−5 | 1.01E−5 | about 3.47 | about 3.47 |
| 4L4S | 5.30E−6 | 3.65E−6 | 1.84E−5 | 1.27E−5 | about 3.48 | about 3.47 |
| 8L1S | 3.33E−6 | 2.30E−6 | 1.19E−5 | 8.23E−6 | about 3.59 | about 3.58 |
| 8L2S | 4.19E−6 | 2.90E−6 | 1.55E−5 | 1.07E−5 | about 3.70 | about 3.69 |
| 8L3S | 5.29E−6 | 3.65E−6 | 1.96E−5 | 1.35E−5 | about 3.70 | about 3.70 |
| 8L4S | 6.65E−6 | 4.60E−6 | 2.47E−5 | 1.70E−5 | about 3.71 | about 3.70 |
| 16L1S | 4.18E−6 | 2.89E−6 | 1.42E−5 | 9.80E−5 | about 3.39 | about 3.39 |
| 16L2S | 5.26E−6 | 3.64E−6 | 1.79E−5 | 1.23E−5 | about 3.40 | about 3.39 |
| 16L3S | 6.64E−6 | 4.58E−6 | 2.26E−5 | 1.55E−5 | about 3.40 | about 3.39 |
| 16L4S | 8.36E−6 | 5.77E−6 | 2.84E−5 | 1.96E−5 | about 3.40 | about 3.39 |

Referring to Table 1, it can be identified that a result value of a maximally bearable bit error rate measured by applying the error check and correction method of the 3D memory in accordance with the example embodiments increases by at least about 1.97 times to maximum about 3.70 times a result value of a maximally bearable bit error rate measured through the conventional error check and correction method. From this result, it can be anticipated that the 3D memory can stably operate even in an environment where many soft errors may occur if the error check and correction method of the 3D memory in accordance with the example embodiments is applied.

The 3D memory and the error check and correction method of the 3D memory in accordance with the example embodiments achieve the effect of improving the error check and correction performance of the upper memory layer by storing the check bits used for the error check and correction of the upper memory layer in the spare cell array of the lower memory layer.

In the 3D memory and the error check and correction method of the 3D memory, the error check and correction performance of the upper memory layer affects the error check and correction performance of the whole 3D memory. Thus, the 3D memory and the error check and correction method of the 3D memory achieves the effect of improving the error check and correction performance of the 3D memory itself by improving the error check and correction performance of the upper memory layer.

The example embodiments of the present disclosure have been described; however, the example embodiments are merely illustrative, and one of ordinary skill in the art of the present disclosure should understand that from the example embodiments, various modifications and embodiments with the scope equivalent to that of the present disclosure can be made. Thus, the technical scope of the present disclosure should be defined by the following claims.

We claim:

1. An error check and correction method of a 3D memory, in which a plurality of memory layers are stacked, the method comprising:
storing check bits, which are used for error check and correction of an upper memory layer among the plurality of the memory layers, in one or more first unused spare columns of the upper memory layer, and storing the check bits in one or more second unused spare columns of one or more lower memory layers among the plurality of the memory layers, the one or more lower memory layers being stacked below the upper memory layer; and
performing the error check and correction of the upper memory layer by using the stored check bits in the one or more first unused spare columns of the upper memory layer and in the one or more second unused spare columns of the one or more lower memory layers,
wherein the 3D memory includes:
each of the plurality of the memory layers comprising a memory cell array with a matrix structure including memory cells and a spare cell array with a matrix structure, and
a master layer, different from the plurality of the memory layers, for controlling the plurality of the memory layers.

2. The error check and correction method of claim 1, wherein the storing of the check bits comprises:
determining whether a faulty column having a faulty memory cell exists in the memory cell array of each of the plurality of the memory layers;
replacing the faulty column with a spare column of a corresponding memory layer having the faulty column if the fault column exists; and
storing first check bits, which are used for the error check and correction of the corresponding memory layer, in one or more first unused spare columns of the corresponding memory layer and storing the first check bits in one or more second unused spare columns of a corresponding lower memory layer stacked below the corresponding memory layer among the plurality of the memory layers.

3. The error check and correction method of claim 2, wherein the storing of the first check bits in the one or more first unused spare columns and in the one or more second unused spare columns further comprises:
electrically connecting the one or more first unused spare columns and the one or more second unused spare columns to the corresponding memory layer to enable a signal to be transmitted and received there between.

4. The error check and correction method of claim 3, wherein the electrical connection between either of the one or more first unused spare columns or the one or more second unused spare columns, and the corresponding memory layer is performed through control of a column selection line included in the corresponding memory layer.

5. The error check and correction method of claim 2, wherein
the first check bits are stored in the one or more first unused spare columns of the corresponding memory layer and in the one or more second unused spare columns of the corresponding lower memory layer stacked below the corresponding memory layer among the plurality of the memory layers, the plurality of the memory layers being different from the master layer.

6. A 3D memory having an error check and correction function, comprising:
a plurality of memory layers each having a memory cell array and a spare cell array including one or more spare columns, and being stacked on one another; and
a master layer, different from the plurality of the memory layers, for controlling the plurality of the memory layers,
wherein the master layer controls a first storing of check bits, which are used for error check and correction of an upper memory layer among the plurality of the memory layers, in one or more first spare columns of the upper memory layer and controls a second storing of the check bits in one or more second spare columns of one or more lower memory layers among the plurality of the memory layers, the one or more lower memory layers being stacked below the upper memory layer, and
the error check and correction of the upper memory layer is performed by using the first and second stored check bits.

7. The 3D memory of claim 6, wherein the master layer determines whether a faulty column having a faulty memory cell exists in the memory cell array of each of the plurality of the memory layers,
replacing the faulty column with a spare column of the spare cell array of a corresponding memory layer having the faulty column if the faulty column exists, and
storing first check bits, which are used for the error check and correction of the corresponding memory layer, in one or more first unused spare columns of the corresponding memory layer and storing the first check bits in one or more second unused spare columns of a corresponding lower memory layer stacked below the corresponding memory layer among the plurality of the memory layers.

8. The 3D memory of claim 7, wherein the master layer electrically connects the one or more first unused spare columns and the one or more second unused spare columns to the corresponding memory layer to enable a signal to be transmitted and received there between.

9. The 3D memory of claim 8, wherein
the master layer performs the electrical connection through a column selection line included in the corresponding memory layer, in which the one or more unused spare columns are arranged, and
the column selection line controls the one or more first unused spare columns and the one or more second unused spare columns.

10. The 3D memory of claim 6, wherein
the 3D memory further comprises a through silicon via electrode that penetrates the plurality of the memory layers,
each of the plurality of the memory layers comprises a plurality of column selection lines that are connected to a plurality of memory columns including the memory cell array and a plurality of spare columns including the spare cell arrays, respectively, and
the master layer electrically connects a spare cell array of the upper memory layer and a spare cell array of a lower memory layer through on/off control of the column selection line and the through silicon via electrode for controlling corresponding check bits to be stored in the upper memory layer and the one or more lower memory layers.

* * * * *